United States Patent [19]
Ishigami et al.

[11] Patent Number: 5,530,467
[45] Date of Patent: Jun. 25, 1996

[54] SPUTTERING TARGET, FILM RESISTOR AND THERMAL PRINTER HEAD

[75] Inventors: Takashi Ishigami; Mituo Kawai; Atsuko Iida, all of Yokohama, Japan

[73] Assignee: Kabushiki Kaisha Toshiba, Kanagawa-ken, Japan

[21] Appl. No.: 689,285

[22] PCT Filed: Jan. 31, 1991

[86] PCT No.: PCT/JP91/00119

§ 371 Date: Jun. 19, 1991

§ 102(e) Date: Jun. 19, 1991

[87] PCT Pub. No.: WO91/11328

PCT Pub. Date: Aug. 8, 1991

[30] Foreign Application Priority Data

Feb. 1, 1990 [JP] Japan .................................. 2-20446

[51] Int. Cl.$^6$ .................................................. B41J 2/335
[52] U.S. Cl. ................. 347/204; 252/512; 252/514
[58] Field of Search ............ 346/76 PH; 252/512, 252/514; 347/204

[56] References Cited

U.S. PATENT DOCUMENTS 4,168,363  9/1979  Arai et al. .................................. 428/426

FOREIGN PATENT DOCUMENTS 60-115462  of 1985  Japan .

Primary Examiner—Huan H. Tran
Attorney, Agent, or Firm—Finnegan, Henderson, Farabow, Garrett & Dunner

[57] ABSTRACT

A sputtering target comprises an oxide containing niobium, a silicide containing niobium and silicon oxide substantially for the rest. The sputtering target is formed e.g. by reactive sintering a powdery niobium or a powdery niobium alloy containing silicon oxide in the range of 15 to 70 mol % by mole ratio. A film resistor formed by using the sputtering target exhibits high specific resistance, good stabilities of resistance and a film composition and excellent reproducibility and is used as a heat generating resistor in e.g. a thermal printer head.

30 Claims, 4 Drawing Sheets

× --- MEASURING POINT

SPUTTERING TARGET, FILM RESISTOR AND THERMAL PRINTER HEAD

BACKGROUND OF THE INVENTION

This invention relates to a sputtering target capable of forming easily and uniformly, a film resistor having high specific resistance, excellent heat resistance, and anti-corrosion property, a film resistor using such a sputtering target and a thermal printer head using such a film resistor.

A thermographic type recording apparatus using a thermal printer head has been used as a recording apparatus in facsimiles machines, copiers and ticket venders with the advantages low noise and less maintenance. In such thermal printer heads, tantalum nitride has been used as a stable material for a film resistor to fuse a printing medium. The Ta-N type film is produced by reactive sputtering a Ta target in a nitrogen environment and although the specific resistance becomes larger as the nitrogen content is increased, $Ta_2N$ has been generally used as a heat generating film resistor because of its reliability and stability.

However, $Ta_2N$ itself has specific resistance of approximately 200 μΩcm and even if the thickness of the film is made very thin to increase the specific resistance, there is a limit in the maximum value. For example, to obtain the resistance of 200 Ω using $Ta_2N$, it is necessary to form a strip shape with 2:1 in the ratio of length and width and thickness of approximately 20 nm. When making such thin films, the control of thickness is very difficult and the reproducibility and uniformity of the film decreases, and consequently the film is easy to damage by increasing the power density.

To improve the defects aforementioned, an idea of forming a film resistor to be a meander type increasing the effective length per unit area thereby increasing the resistance was proposed. However, as the resolution of thermal printer head increase, more high technology for patterning is required and it results in the lowering of the yield. Furthermore, in the manufacturing process, a reactive sputtering method is used wherein the amount of gas introduced into the vacuum reactor is very small and controlling the introduction of such amounts requires exact technology.

On the other hand, Japanese Patent Application Laid-open No. SHO 52(1977)-109947 discloses that high specific resistance film is obtained by using a target where a hollow quartz disc is filled with a heat generating resistor such as TiC. Though the film has excellent oxidation resistance at high temperatures, the control of the composition of the film is difficult and the fluctuation of sheet resistance in the substrate is large.

The application of a thin thermet film to obtain high specific resistance is proposed. As a thermet film, a Ta-$SiO_2$ resistor film and the like is used and it has been made by, e.g., a multi source sputtering method using, for example, both a Ta target and a $SiO_2$ target. However, since the sputtering angles of Ta and Si differ greatly, the compositions of the Ta-$SiO_2$ resistor film and the target deviate from each other due to a slight change of sputtering conditions and the control of the composition of the film is difficult. Because of the aforementioned reasons the composition of the film tends not to be uniform and it results in undesirable large fluctuation of the sheet resistance and less reproducibility.

An object of the present invention is, considering the points mentioned above, to provide a sputtering target which is capable of forming a high specific resistant film with an uniform composition, which is the almost same as that from that of the target. Another object of the present invention is to provide a film resistor with high specific resistance, excellent heat resistance and anti-corrosion characteristics while controlling the fluctuation of the sheet resistance in the film. A further other object is to provide a thermal printer head capable of high speed operation improving the resolution of printed images, using the aforementioned film resistor.

SUMMARY OF THE INVENTION

From the results of examination of a film resistor of a thermal printer head to be used as a heat generator and so forth, the inventors have found that a Nb-$SiO_2$ type film resistor shows high resistance with excellent heat resistivity and anti-corrosion characteristics, and that the reproducibility of the film composition of the aforementioned Nb-$SiO_2$ type film resistor is improved remarkably by using a silicon oxide type compound target containing Nb oxide or Nb silicide.

A sputtering target of the present invention is made based on the aforementioned information and is comprised of niobium, niobium oxide, nobium the balance being silicon oxide rest.

The film resistor of the present invention is by formed by sputtering using the aforementioned sputtering target Further, the thermal printer head of the present invention comprises an insulating substrate; many heat generating resistors disposed thereon; and an electrode connected with the heat generating resistors; wherein the heat generating resistors comprises a film resistor formed by using the aforementioned sputtering target.

The sputtering target of the present invention comprises, as mentioned above, niobium metal which is the main component of a target, niobium oxide and a silicide of niobium. Since sputtering emitting angles of Nb and Si are close, the sputtered film with less deviation in the composition from that of the target is obtainable. And also since a target of the present invention includes niobium oxide or silicide dispersed uniformly in the target, it forms a film possessing a uniform film composition.

The aforementioned sputtering target of the present invention is made by reactive sintering a mixture of niobium or niobium alloy powder and powder of silicon oxide. In the mixture of powders as above, the ratio of powder of silicon oxide is preferable in the range of 15 mol % to 70 mol %. Namely, preferably, the sputtering target of the present invention is obtained by reactive sintering the niobium or niobium alloy powder containing silicon oxide in the range of 15 mol % to 70 mole %.

Further, the reason that mole ratio of silicon oxide in the mixture of the powders is given to be in the range of 15 mol % to 70 mol % is as follows. When the mole ratio of silicon oxide powder exceeds 70 mol %, the sintered body obtained becomes brittle and the workability is poor. Furthermore, the uniformity of a sputtered film formed is lowered and since the change of resistance in the course of the sputtering increases it renders the exact control of resistance of the film sputtered difficult and results in a large fluctuation of sheet resistance. On the other hand, when the mole ratio of silicon oxide in the mixture is less than 15 mol %, the specific resistance of a sputtered film obtained is lowered and the function as a resistor decreases. The more preferable mole ratio of the silicon oxide in the aforementioned powder mixture is in the range of 30 to 60 mole %.

Still further, the sputtering target of the present invention is also obtainable by sintering a mixture comprising a powder of niobium oxide or an oxidized niobium alloy, powdered silicide of niobium or a powdered silicide of a niobium alloy and powdered silicon oxide. In this case the ratio of each powder is not limited to a special value but it is preferably decided referring to the mixture of powders for the reactive sintering as mentioned above.

As a method of sintering of the powder mixture, a hot press method is generally used. After hot isostatic pressing (HIP) or cold isostatic pressing (CIP), sintering at a normal pressure may be conducted.

The starting material of niobium is not limited to powdered niobium and powdered niobium alloy are usable as mentioned above. As a niobium alloy, Nb-Ta alloy or Nb-Fe may be used. Since both niobium and tantalum consist often in the same natural ore in various ratios, an alloy comprising both metals is beneficial from the point of view of the cost and acquisition. Using such niobium alloy powder, the target obtained comprises niobium as a double oxide or double silicide of tantalum and/or iron. Also using the target comprising niobium in the aforementioned form, the same effect as the above is obtained.

The film resistor of the present invention is made of a film formed by sputtering using the above sputtering target and basically has $Nb-SiO_2$ type composition. The film itself is mainly amorphous and thereby exhibits excellent oxidation resistent and heat resistent properties. The aforementioned niobium component may exist as the form of Nb-Ta alloy or Nb-Fe alloy. The aforementioned film resistor is preferably a thin film having thickness of 5 nm to 3000 nm. The more preferable thickness is in the range of 50 nm to 200 nm and more preferable is in the range of 80 nm to 500 nm.

Thus, a film resistor containing silicon oxide as a resistor component and mainly niobium as a metal component exhibits high specific resistance together with excellent heat resistance and anticorrosion properties. It is used as a heat generator of a thermal head printer to generate a large and stable amount of heat, thus allowing the excellent printing record. The density of niobium is approximately a half that of tantalum and the cost per unit weight is also approximately a half that of tantalum. Therefore from the view of cost reduction, it is very advantageous. Since the film resistor of the present invention is produced by using the sputtering target possessing excellent sputtering characteristics (e.g. sputtering emission angle, uniformity in composition and so forth), satisfactory adhesiveness to a substrate is obtained and good reproducibility and uniformity of the composition of the film is also attained because of less deviation in the composition of the film from that of the target. Thus, high specific resistance is realized constantly and fluctuation of sheet resistance is reduced remarkably.

In the case of using the film resistor of the present invention as a heat generator, the film resistor is required to have high specific resistance, which is preferable to be in the range of $10^2$ μΩcm to $10^6$ μΩcm. The film resistor having such high specific resistance has obtained constantly by the use of the sputtering target of the present invention. The film resistor having the specific resistance less than $10^2$ μΩcm can not function as a film resistor having high specific resistance. On the other hand, when the specific resistance exceeds $10^6$ μΩcm, the specific resistance of the film depends on the mole ratio of silicon oxide contained in the target and as increasing the ratio of the silicon oxide in the sputtering target, the sintered target becomes brittle and the stability in the resistance of the film obtained becomes lower. The preferred range of the specific resistance is in the range of $3 \times 10^2$ μΩcm to $6 \times 10^5$ μΩcm, and more preferably in the range of $3 \times 10^3$ μΩcm to $6 \times 10^4$ μΩcm. The term "specific resistance" means the value obtained by multiplying sheet resistance by film thickness.

To provide the film resistor having constantly stable and high specific resistance, a low fluctuation of sheet resistance is required. In the film resistor of the present invention, by mainly using niobium as a metal component and at the same time by the use of the sputtering target of the present invention having the uniform film composition, it is possible to repress the fluctuation of sheet resistance to be 20% or less. If a film having large fluctuation of sheet resistance is used in a thermal printer head, the fluctuation in the amount of heat generated in a substrate will become larger and degrade printing characteristics. It is more desirable that the fluctuation of the sheet resistance is 10% or less.

The aforementioned term "sheet resistance" is the value defined by the following formula.

$$\frac{MA - MI}{AV} \times 100(\%)$$

wherein MA is the maximum value of resistance, MI is the minimum value of resistance, and AV is the average value of resistance.

The fluctuation of sheet resistance as above is measured by CD four proves method (the apparatus used; RESIST-EST-8A, made in Napson KK.) on the measuring points (shown as x) as shown in FIG. 5. These measuring points are put on the centers of as many complete 5 mm squares as possible divided on the area of a film on a substrate A.

The thermal printer head of the present invention uses the film resistor having the aforementioned characteristics as a heat generator, thus responding to high speed printing and high temperature resistivity and possessing good stability and high resolution of printing.

DESCRIPTION OF THE PREFERRED EMBODIMENT(S)

Figure 1:
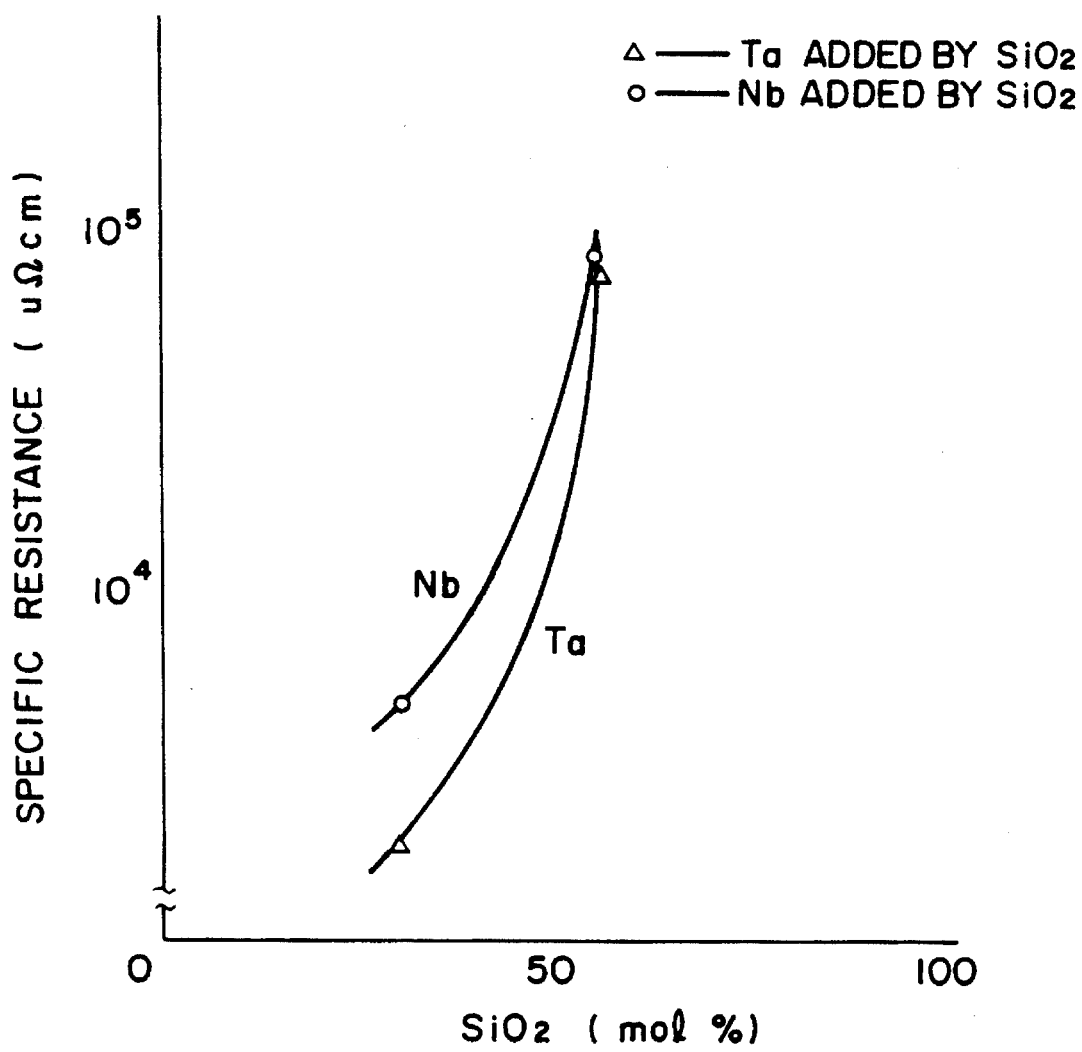
FIG. 1 is a graph showing the relation between the amount of $SiO_2$ in the target used and the film resistance of a $Nb-SiO_2$ type film resistor produced in an example according to the present invention, comparing to that of a conventional $Ta-SiO_2$ type film resistor.

Now, this invention will be described below in more detail with examples.

EXAMPLE 1

Powder of Nb with an average particle size of 3 μm and powder of silicon oxide fully dried with an average particle size of 1 μm were weighed out so that the ratio of Nb/SiO$_x$ was 70/30 by mole ratio and mixed in a ball mill in a vacuum for 18 hours. Then the mixture was pressed by a vacuum hot press apparatus at 100 kg/cm$^2$ and subjected to reactive sintering at 1400° C. for 1 hour to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 300 W, Ar flow rate of 17 sccm and gas pressure of 5.3 mTorr to 5.5 mTorr, a film of 100 nm in thickness was formed on a glazed alumina substrate of 3 inches in size.

EXAMPLE 2

Powder of Nb with an average particle size of 3 μm and powder of silicon oxide fully dried with an average particle size of 1 μm were weighed out so that the ratio of Nb/SiO$_x$ was 55/45 by mole ratio and mixed in a ball mill in a vacuum for 18 hours. Then the mixture was pressed by a vacuum hot press apparatus at 100 kg/cm$^2$ and subjected to reactive sintering at 1400° C. for 1 hour to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 300 W, Ar flow rate of 17 sccm and gas pressure of 5.3 mTorr to 5.5 mTorr, a film of 100 nm in thickness was formed on a glazed alumina substrate of 3 inches in size.

EXAMPLE 3

Powder of Nb with an average particle size of 3 μm and powder of silicon oxide fully dried with an average particle size of 1 μm were weighed out so that the ratio of Nb/SiO$_x$ wets 45/55 by mole ratio and mixed in a ball mill in a vacuum for 18 hours. Then the mixture was pressed by a vacuum hot press apparatus at 100 kg/cm$^2$ and subjected to reactive sintering at 1400° C. for 1 hour to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then,, using the sputtering target obtained above, by high frequency magnetron sputtering at the conditions, output power of 300 W, Ar flow rate of 17 sccm and gas pressure of 5.3 mTorr to 5.5 mTorr, a film of 100 nm in thickness was formed on a glazed alumina substrate of 3 inches in size.

EXAMPLE 4

Powder of Nb alloy containing 15 mol % of Ta with an average particle size of 3 μm (Nb*) and powder of silicon oxide fully dried with an average particle size of 1 μm were weighed out so that the ratio of Nb*/SiO$_x$ was 70/30 by mole ratio and mixed in a ball mill in a vacuum for 18 hours. Then the mixture was pressed by a vacuum hot press apparatus at 100 kg/cm$^2$ and subjected to reactive sintering at 1400° C. for 1 hour to obtain the objective sintered body. The component contained in the sintered body was identified by X-ray microanalyzer analysis and X-ray diffraction analysis and the presence of niobium oxide, tantalum oxide, niobium silicide, tantalum silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 300 W, Ar flow rate of 17 sccm and gas pressure of 5.3 mTorr to 5.5 mTorr, a film of 100 nm in thickness was formed on a glazed alumina substrate of 3 inches in size.

EXAMPLE 5

Powder of Nb alloy containing 35 mol % of Ta with an average particle size of 3 μm (Nb*) and powder of silicon oxide fully dried with an average particle size of 1 μm were weighed out so that the ratio of Nb*/SiO$_x$ was 70/30 by mole ratio and mixed in a ball mill in a vacuum for 18 hours. Then the mixture was pressed by a vacuum hot press apparatus at 100 kg/cm$^2$ and subjected to reactive sintering at 1400° C. for 1 hour to obtain the objective sintered body. The component contained in the sintered body was identified by X-ray microanalyzer analysis and X-ray diffraction analysis and the presence of niobium oxide, tantalum oxide, niobium silicide, tantalum silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

EXAMPLE 6

Powder of Nb alloy containing 15 mol % of Fe with an average particle size of 3 μm (Nb*) and powder of silicon oxide fully dried with an average particle size of 1 μm were weighed out so that the ratio of Nb*/SiO$_x$ was 70/30 by mole ratio and mixed in a ball mill in a vacuum for 18 hours. Then the mixture was pressed by a vacuum hot press apparatus at 100 kg/cm$^2$ and subjected to reactive sintering at 1400° C. for 1 hour to obtain the objective sintered body. The component contained in the sintered body was identified by X-ray microanalyzer analysis and X-ray diffraction analysis and the presence of niobium oxide, iron oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

EXAMPLE 7

Powder of Nb alloy containing 35 mol % of Fe with an average particle size of 3 μm (Nb*) and powder of silicon oxide fully dried with an average particle size of 1 μm were weighed out so that the ratio of Nb*/SiO$_x$ was 70/30 by mole ratio and mixed in a ball mill in a vacuum for 18 hours. Then the mixture was pressed by a vacuum hot press apparatus at 100 kg/cm$^2$ and subjected to reactive sintering at 1400° C. for 1 hour to obtain the objective sintered body. The component contained in the sintered body was identified by X-ray microanalyzer analysis and X-ray diffraction analysis and the presence of niobium oxide, iron oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

EXAMPLE 8

The mixture powder of Nb$_5$Si$_3$ and Nb$_2$O$_5$ with an average particle size of 7 μm in the ratio of 2:1 by weight and powder of silicon oxide fully dried with an average particle size of 3 μm were weighed out so that the ratio of Nb in the sputtering target objected was 78% by weight and mixed in a ball mill in an atmosphere of argon for 18 hours. Then the mixture was pressed by a vacuum hot press apparatus at 100 kg/cm$^2$ and subjected to sintering at 1500° C. for 3.5 hours to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

EXAMPLE 9

The mixture powder of Nb$_5$Si$_3$ and Nb$_2$O$_5$ with an average particle size of 7 μm in the ratio of 2:1 by weight and powder of silicon oxide fully dried with an average particle size of 3 μm were weighed out so that the ratio of Nb in the sputtering target objected was 78% by weight and mixed in a ball mill in an atmosphere of argon for 18 hours. Then the mixture was pressed by a vacuum hot press apparatus at 100 kg/cm$^2$ and subjected to sintering at 1600° C. for 3.5 hours to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

EXAMPLE 10

The mixture powder of Nb$_5$Si$_3$ and Nb$_2$O$_5$ with an average particle size of 7 μm in the ratio of 10:3 by weight and powder of silicon oxide fully dried with an average particle size of 3 μm were weighed out so that the ratio of Nb in the sputtering target objected was 65.4% by weight and mixed in a ball mill in an atmosphere of argon for 18 hours. Then the mixture was pressed by a vacuum hot press apparatus at 100 kg/cm$^2$ and subjected to sintering at 1500° C. for 3.5 hours to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

EXAMPLE 11

The mixture powder of Nb$_5$Si$_3$ and Nb$_2$O$_5$ with an average particle size of 7 μm in the ratio of 10:3 by weight and powder of silicon oxide fully dried with an average particle size of 3 μm were weighed out so that the ratio of Nb in the sputtering target objected was 65.4% by weight and mixed in a ball mill in an atmosphere of argon for 18 hours. Then the mixture was pressed by a vacuum hot press apparatus at 100 kg/cm$^2$ and subjected to sintering at 1600° C. for 3.5 hours to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

EXAMPLE 12

The mixture powder of Nb$_5$Si$_3$ and Nb$_2$O$_5$ with an average particle size of 7 μm in the ratio of 10:9 by weight and powder of silicon oxide fully dried with an average particle size of 3 μm were weighed out so that the ratio of Nb in the sputtering target objected was 56% by weight and mixed in a ball mill in an atmosphere of argon for 18 hours. Then the mixture was pressed by a vacuum hot press apparatus at 100 kg/cm$^2$ and subjected to sintering at 1500° C. for 3.5 hours to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

EXAMPLE 13

The mixture powder of $Nb_5Si_3$ and $Nb_2O_5$ with an average particle size of 7 μm in the ratio of 10:9 by weight and powder of silicon oxide fully dried with an average particle size of 3 μm were weighed out so that the ratio of Nb in the sputtering target objected was 56% by weight and mixed in a ball mill in an atmosphere of argon for 18 hours. Then the mixture was pressed by a vacuum hot press apparatus at 100 kg/cm$^2$ and subjected to sintering at 1600° C. for 3.5 hours to obtain the objective sintered body. The component contained in the sintered body was identified by X-ray microanalyzer analysis and X-ray diffraction analysis and the presence of niobium oxide, niobium silicide and silicon oxide was confirmed. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

Comparative Example 1

Powder of Ta with an average particle size of 3 μm and powder of silicon oxide fully dried with an average particle size of 1 μm were weighed out so that the ratio of Ta/SiO$_x$ was 70/30 by mole ratio and mixed in a ball mill in a vacuum for 18 hours. Then the mixture was pressed by a vacuum hot press apparatus at 100 kg/cm$^2$ and subjected to reactive sintering at 1400° C. for 1 hour to obtain the objective sintered body. The surface of the sintered body was machined and ground approximately 1 mm to obtain a sputtering target with a diameter of 5 inches and thickness of 5 mm.

Then using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

Comparative Example 2

Powder of Ta with an average particle size of 3 μm and powder of silicon oxide fully dried with an average particle size of 1 μm were weighed out so that the ratio of Ta/SiO$_x$ was 45/55 by mole ratio and mixed in a ball mill in a vacuum for 18 hours. Then the mixture was pressed by a vacuum hot press apparatus at 100 kg/cm$^2$ and subjected to reactive sintering at 1500° C. for 1 hour to obtain the objective sintered body. The surface of the sintered body was machined and ground approximately 1 mm to obtain a sputtering target with a diameter of 5 inches and thickness of 5 mm.

Then, using the sputtering target obtained above, by high frequency magnetron sputtering at the conditions, output power of 200 W, Ar flow rate of 17 sccm and gas pressure of 5.3 mTorr to 5.5 mTorr, a film of 100 nm in thickness was formed on a glazed alumina substrate of 3 inches in size.

The specific resistance and fluctuation of sheet resistance of the thin films obtained in the examples and comparative examples were measured. The results were shown in Table 1. The fluctuation of sheet resistance was measured by the method and the formula mentioned before.

TABLE 1

|  | Fluctuation of sheet resistance (%) | Specific resistance (μ Ω cm) |
| --- | --- | --- |
| Example 1 | 5.4 | 2000 |
| Example 2 | 6.0 | 8500 |
| Example 3 | 6.3 | 80100 |
| Example 4 | 6.0 | 4300 |
| Example 5 | 6.2 | 4800 |
| Example 6 | 5.5 | 9800 |
| Example 7 | 5.0 | 15000 |
| Example 8 | 8.5 | 3000 |
| Example 9 | 8.0 | 2900 |
| Example 10 | 14.0 | 9500 |
| Example 11 | 13.5 | 9400 |
| Example 12 | 17.5 | 79100 |
| Example 13 | 16.2 | 76000 |
| Comparative Example 1 | 20.5 | 215 |
| Comparative Example 2 | 30.2 | 73000 |

As clearly shown in Table 1, in the case where the conventional target was used, the fluctuation of sheet resistance was remarkably large and the control of the resistance of film was difficult, while in the case where the sputtering target obtained by reactive sintering was used, the structure of the sputtering target was *densified and the stable film which exhibited an extremely small fluctuation of sheet resistance could be obtained. Moreover, it was also found that in the case where the sputtering target obtained by sintering the powder mixture comprising silicon oxide, niobium oxide and niobium silicide was used, a film which exhibited less fluctuation of sheet resistance than that of a conventional film was obtained. Further, as shown in Table 1, the larger the content of the metal becomes, the lower the fluctuation of sheet resistance. Even if an alloy containing Ta, Fe and the like was used, good stability was obtained.

Based on the results of measuring specific resistance of thin films obtained in the examples and comparative examples, the relation between the specific resistance and the amount of $SiO_2$ in the Nb and Ta targets is shown in FIG. 1. As shown in FIG. 1, in the both metal cases, as the content of $SiO_2$ increases, the specific resistance increased remarkably. However, the rate of the increase is larger in the case of Nb.

Table 2 shows the relation between the compositions of the targets obtained in the examples and comparative examples and the composition of the films obtained by sputtering the targets. From these results, it is found that by using the sputtering target of each example, a film having substantially the same composition of the sputtering target was obtained with good reproducibility. It is also found that even if an alloy containing Ta, Fe and the like was used, the characteristics of the film obtained was the almost same as those of the aforementioned films.

TABLE 2

| | composition (component/SiO$_2$, mol %) | | |
|---|---|---|---|
| | component | target | film |
| Example 1 | Nb | 2.3 | 2.30 |
| Example 2 | Nb | 1.2 | 1.21 |
| Example 3 | Nb | 0.8 | 0.78 |
| Example 4 | Nb-15 mol % Ta | 2.3 | 2.28 |
| Example 5 | Nb-35 mol % Ta | 2.3 | 2.31 |
| Example 6 | Nb-15 mol % Fe | 2.3 | 2.30 |
| Example 7 | Nb-35 mol % Fe | 2.3 | 2.28 |
| Example 8 | Nb | 2.2 | 2.20 |
| Example 9 | Nb | 2.3 | 2.30 |
| Example 10 | Nb | 1.3 | 1.35 |
| Example 11 | Nb | 1.3 | 1.30 |
| Example 12 | Nb | 0.7 | 0.75 |
| Example 13 | Nb | 0.8 | 0.80 |
| Comparative Example 1 | Ta | 2.3 | 2.90 |
| Comparative Example 2 | Ta | 0.8 | 1.06 |

Figure 2:
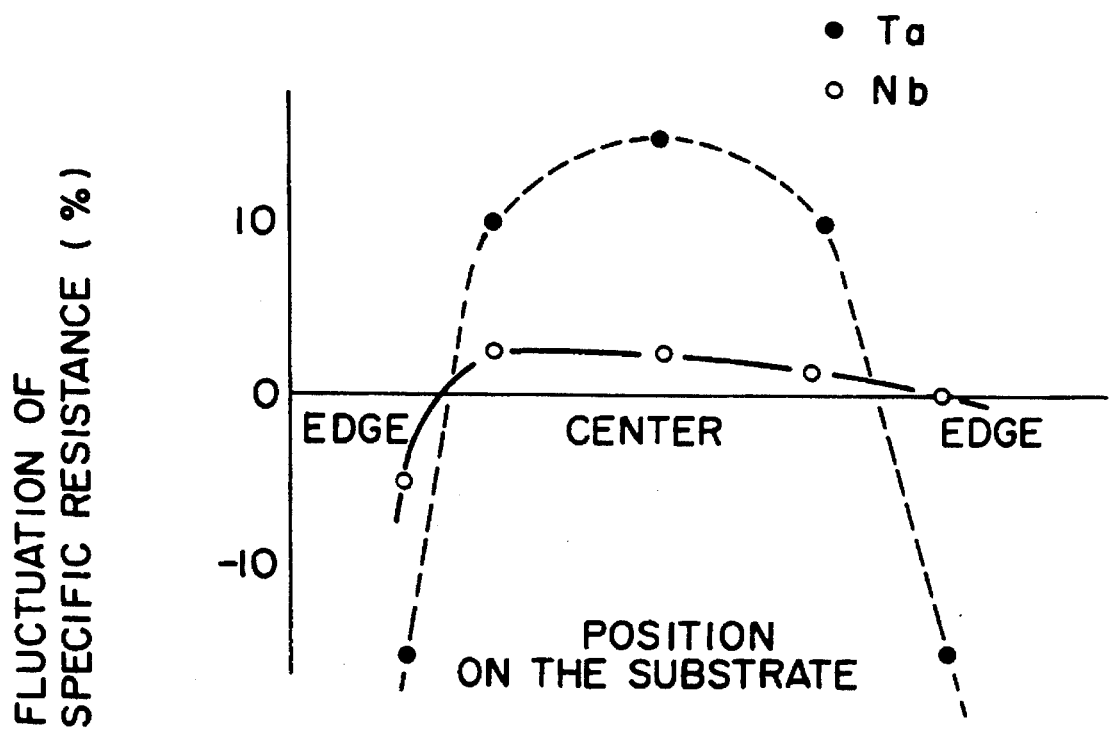
FIG. 2 is a graph showing the relation between the position on a substrate and the specific resistance of a $Nb-SiO_2$ type film resistor produced in an example according to the present invention, comparing to that of a conventional $Ta-SiO_2$ type film resistor.

Furthermore, a sputtering target of 121 mm ×378 mm×7.5 mm having the same composition as that of example 3 was produced and a glazed alumina substrate (A4 size) was moved reciprocally in the direction perpendicular to the long side of the target to form a film of 100 nm in thickness. The film resistance thereof was measured. As a comparison, a target of 121 mm×378 mm×7.5 mm having the same composition as that of comparative example 2 was prepared and the film resistance was measured in the same manner as before. The results obtained were shown in FIG. 2. From the figure, it is clearly shown that the fluctuation of a substrate in the sputtering target of the present invention was improved remarkably, compared with that in the conventional one.

Now, embodiments of a thermal printer head according to the present invention will be disclosed as follow.

Figure 3:
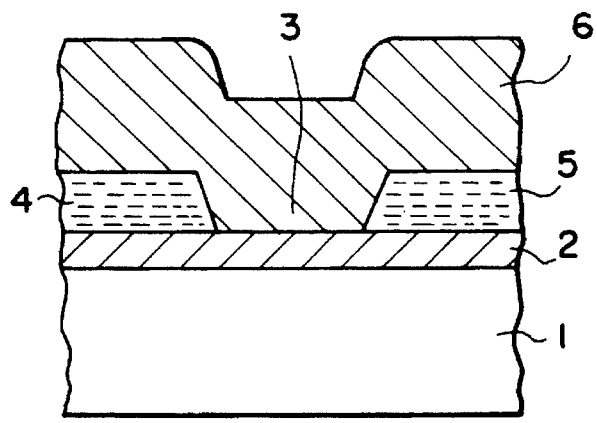
FIG. 3 is a sectional view schematically showing the structure of a thermal printer head of an example according to the present invention.
Figure 5:
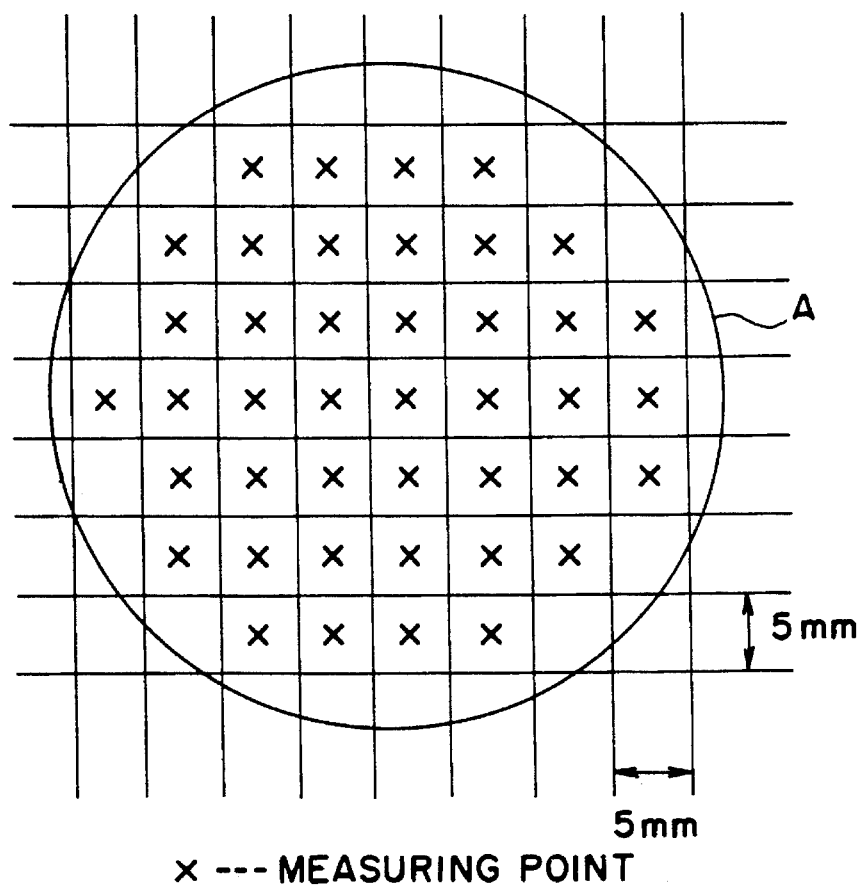
FIG. 5 shows the points of measuring sheet resistance on a substrate.

The thermal printer head used in the embodiment will be described referring to FIG. 3. In the figure, the numeral 1 shows an insulating substrate such as a ceramic substrate and metal substrate coated by an insulating layer on the surface. On the insulating substrate 1, a heat generating resistor layer 2 was formed and the heat generating resistor layer 2 was patterned to constitute a group of heat generating resistors. On each heat generating resistor 2, a common electrode 4 and an individual electrode 5 made of aluminum and so forth were arranged so that an opening as a heat generating part 3 was formed. A protection layer 6 with thickness of approximately 100 nm to 10 μm was formed so as to cover at least the heat generating part 3. The preferable thickness of the protection layer is 1 μm to 5 μm and more preferably 3 μm to 4 μm.

Figure 4:
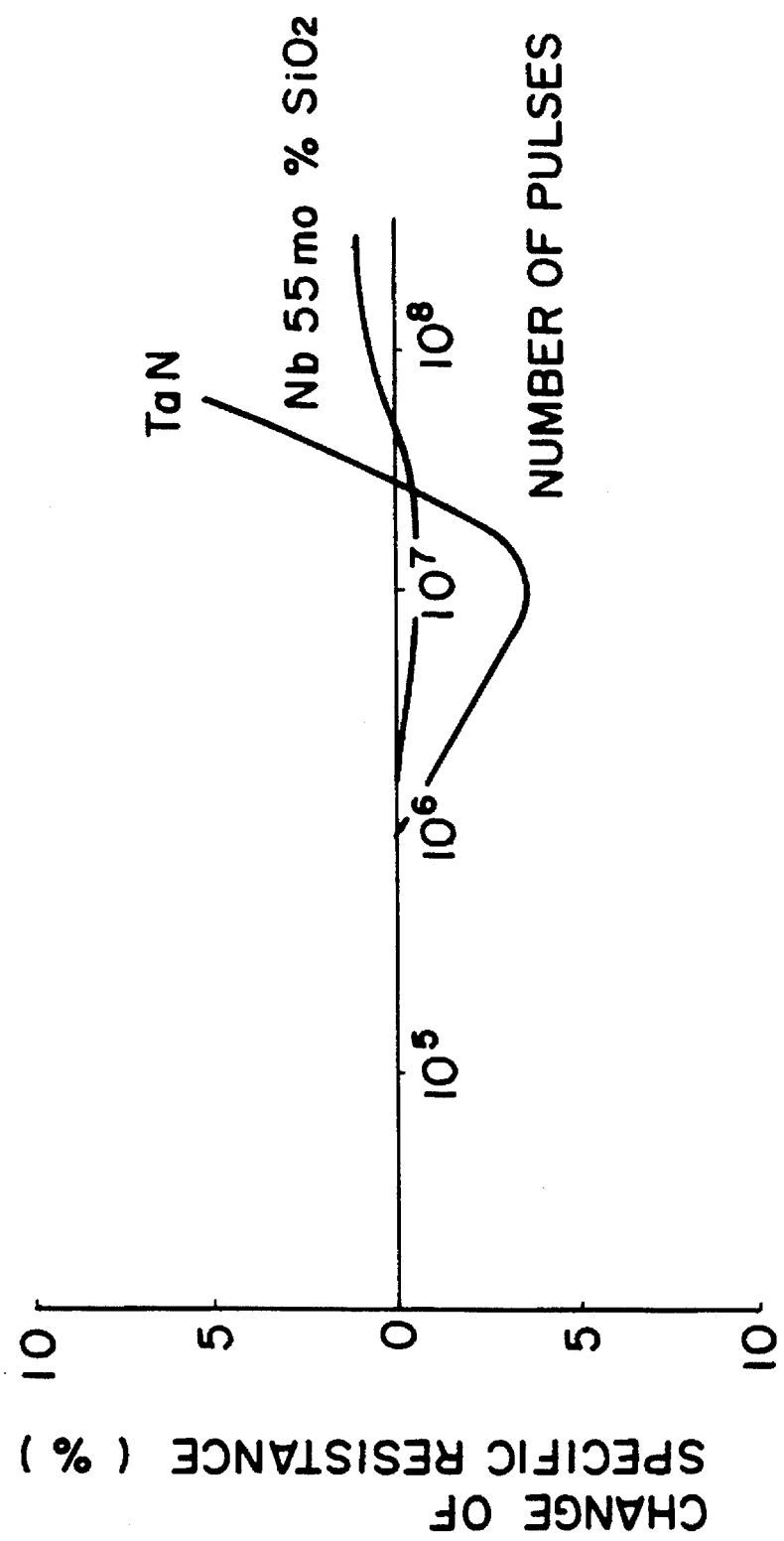
FIG. 4. is a graph showing the change percentage of resistance when a heating pulse is applied to a thermal printer head using a $Nb-SiO_2$ type film resistor as a heat generator, the $Nb-SiO_2$ type film resistor produced in an example according to the present invention, comparing to that of a conventional thermal printer head.

First, the glazed alumina substrate where a film resistor was deposited according to example 3, was used as an insulating substrate 1 of a thermal printer head as above. At the same time, a film resistor was used as a heat generating resistor 2. After the film resistor was patterned, aluminum electrodes 4 and 5 were arranged on each heat generating resistor 2 and then a protection layer was deposited to obtain a thermal printer head. Heating pulses with pulse width of 0.3 sec and the cycle of 5 msec were applied to the thermal printer head obtained above. At this time, the change percentage of the resistance was shown in FIG. 4. For comparison, the results obtained on a thermal printer head using a conventional TaN resistor film were shown together with the above.

As clearly shown from the results, the thermal printer head of the present invention exhibits smaller fluctuation of the resistance caused by heating pulses and more excellent heat resistance property, compared with the thermal printer head using the TaN resistor film.

In addition, in the present invention, if an alloy comprising Nb and Ta contains a small amount of Fe or an alloy comprising Nb and Fe contains a small amount of Ta, the similar results are obtained.

As clearly shown in the above examples, by using the sputtering target of the present invention, high resistance resistor film with constant value of resistance and the constant film composition can be formed with high reproducibility. In the case where Nb was used as a target material, sputter rate is more uniform, compared with the case where Ta was used. Thus, the film formed by using the target of Nb was improved in the uniformity. Furthermore, since the target of the present invention is not formed by the reactive sputtering method, any delicate control of gas is not required and the manufacturing method is simplified. The thermal printer head of the present invention is a thin film type thermal printer head, which is provided with the above film resistor of the present invention with high specific resistance, high heat stability, and high heat resistance as a heat generator. Thus, this thermal printer head can satisfy the requirements for high speed operation and high temperature resistance, and a thermal printer head with excellent printing characteristics is obtained due to uniformity of resistance in head. The, thermal head printer of the present invention is very valuable from the view of industrial applications.

As mentioned above, the film resistor formed by using the sputtering target of the present invention is valuable for the use as a heat generator of a thermal printer head and so forth because the film composition and the resistance thereof are constant and the specific resistance is high. Further, the thermal printer head of the present invention is useful as a recording device where miniaturization and high performances are required because the thermal printer head enables a high speed operation and high heat resistance easily and satisfies high quality of a printed image.

What is claimed is:

1. A sputtering target consisting of a sintered body, said sintered body comprising at least one niobium component selected from the group consisting of niobium oxide, oxidized niobium alloy, niobium silicide, and a silicide of niobium alloy, the balance of said sintered body consisting essentially of a silicon oxide, and wherein said niobium component is uniformly dispersed in said sintered body.

2. A sputtering target as claimed in claim 1, wherein said sputtering target is formed by reactive sintering powdered niobium or powdered niobium alloy and silicon oxide, said silicon oxide being present in the range of 15 to 70 mol. % by mole ratio.

3. A sputtering target as claimed in claims 2, wherein said niobium alloy comprises: niobium and tantalum; niobium, tantalum and iron; or niobium and iron.

4. A sputtering target as claimed in claim 1, wherein said sputtering target is formed by sintering a mixture comprising powdered niobium oxide or a powdered, oxidized niobium alloy, powdered niobium silicide or a silicide of a niobium alloy, the balance of said mixture consisting essentially of powdered silicon oxide.

5. A sputtering target as claimed in claim 4, wherein said niobium alloy comprises: niobium and tantalum; niobium, tantalum and iron; or niobium and iron.

6. A sputtering target as claimed in claim 1, wherein said sintered body comprises a first niobium component selected from the group consisting: of niobium silicide, silicide of a niobium alloy and mixtures thereof, and a second niobium component selected from the group consisting of: niobium oxide, oxidized niobium alloy and mixtures thereof, the balance of said sintered body consisting essentially of a silicon oxide.

7. A film resistor formed by sputtering using a sintered sputtering target, said target comprising at least one niobium component selected from the group consisting of niobium oxide, oxidized niobium alloy, niobium silicide, and a silicide of niobium alloy, the balance of said target consisting essentially of a silicon oxide, and wherein said niobium component is uniformly dispersed in said sintered sputtering target.

8. A film resistor as claimed in claim 7, wherein said sputtering target is formed by reactive sintering powdered niobium or powdered niobium alloy and silicon oxide, said silicon oxide being present in the range of 15 to 70 mol. % by mole ratio.

9. A film resistor as claimed in claim 8, wherein said niobium alloy comprises: niobium and tantalum; niobium, tantalum and iron; or niobium and iron.

10. A film resistor as claimed in claim 7, wherein, said sputtering target is formed by sintering a mixture comprising powdered niobium oxide or a powdered, oxidized niobium alloy, powdered niobium silicide or a silicide of a niobium alloy, the balance of said mixture consisting essentially of powdered silicon oxide.

11. A film resistor as claimed in claim 10, wherein said niobium alloy comprises: niobium and tantalum; niobium, tantalum and iron; or niobium and iron.

12. A film resistor as claimed in claim 7, wherein said film resistor has a specific resistance in the range of $10^2$ μΩcm to $10^6$ μΩcm.

13. A film resistor as claimed in claim 7, wherein said film resistor has a sheet resistance, said resistance having a fluctuation of 20% or less.

14. A film resistor as claimed in claim 7, wherein said film resistor has film thickness of 5 nm to 3000 nm.

15. A film resistor as claimed in claim 7, wherein said sintered sputtering target comprises a first niobium component selected from the group consisting of: niobium silicide, silicide of a niobium alloy and mixtures thereof, and a second niobium component selected from the group consisting of: niobium oxide, oxidized niobium alloy and mixtures thereof, the balance of said target consisting essentially of a silicon oxide.

16. A thermal printer head comprising an insulating substrate, a plurality of heat generating resistors disposed on said substrate and an electrode connected to the heat generating resistors, wherein each of said heat generating resistors comprise a film resistor formed by sputtering using a sintered sputtering target comprised of at least one niobium component selected from the group consisting of niobium oxide, oxidized niobium alloy, niobium silicide, and a silicide of niobium alloy, the balance of said target consisting essentially of a silicon oxide, and wherein said niobium component is uniformly dispersed in said sintered sputtering target.

17. A thermal printer head as claimed in claim 16, wherein each of said said heat generating resistors comprises a film resistor formed by sputtering using a sintered sputtering target obtained by reactive sintering powdered niobium or powdered niobium alloy and silicon oxide, said silicon oxide being present in the range of 15 to 70 mol. % by mole ratio.

18. A thermal printer head as claimed in claim 17, wherein said niobium alloy comprises: niobium and tantalum; niobium, tantalum and iron; or niobium and iron.

19. A thermal printer head as claimed in claim 16, wherein each of said said heat generating resistors comprises a film resistor formed by sputtering using a sintered sputtering target obtained by sintering a mixture comprising powdered niobium oxide or a powdered, oxidized niobium alloy, powdered niobium silicide or a silicide of a niobium alloy, the balance of said mixture consisting essentially of powdered silicon oxide.

20. A thermal printer head as claimed in claim 19, wherein said niobium alloy comprises: niobium and tantalum; niobium, tantalum and iron; or niobium and iron.

21. A thermal printer head as claimed in claim 16, wherein each said film resistor has a specific resistance in the range of $10^2$ μΩcm to $10^6$ μΩcm.

22. A thermal printer head as claimed in claim 16, wherein each of said said heat generating resistor,has a sheet resistance, said resistance having a fluctuation of 20% or less.

23. A thermal printer head as claimed in claimed in claim 16, wherein each of said said heat generating resistors includes a protection film, said film having a thickness of 100 nm to 10 μm.

24. A thermal printer head as claimed in claim 16, wherein said sintered sputtering target comprises a first niobium component selected from the group consisting of: niobium silicide, silicide of a niobium alloy and mixtures thereof, and a second niobium component selected from the group consisting of niobium oxide, oxidized niobium alloy and mixtures thereof, the balance of said target consisting essentially of a silicon oxide.

25. A film resistor having a primarily amorphous structure, said film of the resistor consisting essentially of niobium components selected from the group consisting of niobium, niobium oxide, and niobium silicide, and silicon oxide wherein said niobium components are uniformly dispersed in said film resistor.

26. A film resistor having a primarily amorphous structure, said film of the resistor consisting essentially of niobium and oxides and silicides of component elements selected from the group consisting of niobium, tantalum, and iron, the balance consisting essentially of silicon oxide wherein said component elements are uniformly dispersed in said film resistor.

27. A thermal printer head comprising an insulating substrate, a plurality of heat generating resistors on said substrate and an electrode connected to the heat generating resistors, wherein each said heat generating resistor comprises a film resistor having a primarily amorphous structure, said film consisting essentially of niobium components selected from the group consisting of niobium niobium oxide, and niobium silicide, and silicon oxide wherein said niobium components are uniformly dispersed in said film resistor.

28. A sputtering target comprising a component material selected from the group consisting of niobium oxide, niobium silicide, and mixtures thereof, the balance of said target consisting essentially of a silicon oxide wherein said component material is uniformly dispersed in said sputtering target.

29. A sputtering target as claimed in claim 28, wherein said target consists essentially of oxides and silicides of materials selected from the group consisting of: niobium, tantalum and iron.

30. A sputtering target comprising a component material selected from the group consisting of niobium oxide, niobium silicide, iron oxide, iron silicide, tantalum oxide, tantalum silicide, and mixtures thereof, the balance of said target consisting essentially of a silicon oxide wherein said component material is uniformly dispersed in said sputtering target.

* * * * *

UNITED STATES PATENT AND TRADEMARK OFFICE
CERTIFICATE OF CORRECTION

PATENT NO. : 5,530,467
DATED : June 25, 1996
INVENTOR(S) : Takashi ISHIGAMI et al It is certified that error appears in the above-indentified patent and that said Letters Patent is hereby corrected as shown below:

Claim 3, Column 12, Line 52, "claims 2" should read as --claim 2--;

Claim 6, Column 12, Line 66, "consisting:of" should read as --consisting of:--;

Claim 10, Column 13, Line 21, "wherein, said" should read as --wherein said--;

Claim 22, Column 14, Line 15, "resistor, has" should read as --resistors has--.

Signed and Sealed this

Twelfth Day of November, 1996

Attest:

BRUCE LEHMAN

Attesting Officer     Commissioner of Patents and Trademarks